United States Patent
Nettesheim et al.

(10) Patent No.: US 12,532,402 B2
(45) Date of Patent: Jan. 20, 2026

(54) DEVICE AND METHOD FOR GENERATING A DIELECTRIC BARRIER DISCHARGE

(71) Applicant: TDK Electronics AG, Munich (DE)

(72) Inventors: Stefan Nettesheim, Regensburg (DE); Robert Krumphals, Deutschlandsberg (AT); Johann Pichler, Breitenau Am Hochlantsch (AT); Markus Puff, Graz (AT)

(73) Assignee: TDK Electronics AG, Munich (DE)

( * ) Notice: Subject to any disclaimer, the term of this patent is extended or adjusted under 35 U.S.C. 154(b) by 227 days.

(21) Appl. No.: 18/043,689

(22) PCT Filed: Sep. 15, 2021

(86) PCT No.: PCT/EP2021/075290
§ 371 (c)(1),
(2) Date: Mar. 1, 2023

(87) PCT Pub. No.: WO2022/058333
PCT Pub. Date: Mar. 24, 2022

(65) Prior Publication Data
US 2023/0276561 A1    Aug. 31, 2023

(30) Foreign Application Priority Data
Sep. 16, 2020   (DE) .......................... 102020124138.0

(51) Int. Cl.
*H05H 1/24*        (2006.01)
*H10N 19/00*       (2023.01)

(52) U.S. Cl.
CPC .......... *H05H 1/2437* (2021.05); *H10N 19/00* (2023.02); *H05H 1/2439* (2021.05);
(Continued)

(58) Field of Classification Search
CPC .............. H05H 1/2437; H05H 1/2439; H05H 2242/22; H05H 2245/34; H05H 2242/10; H10N 19/00
See application file for complete search history.

(56) References Cited

U.S. PATENT DOCUMENTS 8,865,996 B2 * 10/2014 Czubarow .............. D01D 10/02
136/212
2004/0021475 A1 * 2/2004 Ito ...................... G01R 31/2886
324/762.05
(Continued)

FOREIGN PATENT DOCUMENTS

CA          1282031 C        3/1991
CN      113196199 A  *   7/2021   ......... G05D 23/1393
(Continued)

OTHER PUBLICATIONS

Pekarek, S., et al., "Temperature- and airflow-related effects of ozone production by surface dielectric barrier discharge in air", The European Physical Journal D, Oct. 21, 2014, pp. 1 to 9.

*Primary Examiner* — Jimmy T Vu
(74) *Attorney, Agent, or Firm* — Slater Matsil, LLP (57) ABSTRACT

In an embodiment a device includes a thermoelectric component, an electrode arranged opposite the thermoelectric component and a high voltage source configured to generate a high voltage between the thermoelectric component and the electrode sufficient to ignite a dielectric barrier discharge.

35 Claims, 5 Drawing Sheets

(52) U.S. Cl.
CPC ..... *H05H 2242/10* (2013.01); *H05H 2242/22* (2021.05); *H05H 2245/34* (2021.05)

(56) References Cited

U.S. PATENT DOCUMENTS

| | | | | |
|---|---|---|---|---|
| 2012/0227780 A1* | 9/2012 | Kurihara | ................ | H10N 10/17 |
| | | | | 136/224 |
| 2013/0081663 A1* | 4/2013 | Yang | ...................... | H10N 10/17 |
| | | | | 136/203 |
| 2016/0290684 A1* | 10/2016 | Lee | ......................... | F25B 21/04 |
| 2023/0071949 A1* | 3/2023 | Suzuki | ................. | H10F 39/811 |

FOREIGN PATENT DOCUMENTS

| | | | | | |
|---|---|---|---|---|---|
| DE | 3425111 | A1 | 1/1986 | | |
| DE | 19745316 | A1 | 4/1999 | | |
| DE | 102011085790 | A1 | 5/2013 | | |
| DE | 102016006064 | A1 | 11/2017 | | |
| EP | 567114 | A2 * | 10/1993 | ............. | C01B 13/11 |
| EP | 2564879 | A1 | 3/2013 | | |
| EP | 2762236 | A1 | 8/2014 | | |
| JP | S52117295 | A | 10/1977 | | |
| JP | H10120405 | A | 5/1998 | | |
| JP | 2006092787 | A | 4/2006 | | |
| JP | 2010254524 | A | 11/2010 | | |

\* cited by examiner

DEVICE AND METHOD FOR GENERATING A DIELECTRIC BARRIER DISCHARGE

This patent application is a national phase filing under section 371 of PCT/EP2021/075290, filed Sep. 15, 2021, which claims the priority of German patent application 102020124138.0, filed Sep. 16, 2020, each of which is incorporated herein by reference in its entirety.

TECHNICAL FIELD

The present invention relates to a device for generating a dielectric barrier discharge, an appliance comprising such a device, and a method for generating a dielectric barrier discharge.

BACKGROUND

Dielectric barrier discharges are often used in ozone generators where ozone is to be generated from an air stream by a surface discharge. An air stream that forms the process gas from which ozone is generated is often also used to cool the device. To avoid overheating of the device, a minimum air volume is required, which leads to dilution of the ozone generated, thus limiting the ozone concentration that can be generated.

In medical applications, a very high ozone concentration of more than 10000 ppm can be beneficial. A high ozone concentration has a strong effect on microorganisms and can greatly reduce the time to complete killing of an initial population. If microorganisms are exposed to a high ozone concentration for a short period of time, the effects on the surface of the exposed material will predominate. Small structures, for example, viruses with an extension of about 50 nm and bacteria with an extension of less than 1 µm are severely damaged during short exposure to high ozone concentration. Thicker structures, such as human skin, are tolerant of the short exposure because the depth of effect remains diffusion-limited at the short exposure. To kill microorganisms without damaging human skin, it is advantageous to expose it to a high ozone concentration for a very short time to achieve a germicidal effect on the surface with little effect on volume.

SUMMARY

Embodiments provide an improved device for generating a dielectric barrier discharge. For example, the device should allow ozone to be generated at a high concentration without overheating.

A device for generating a dielectric barrier discharge is proposed, comprising a thermoelectric component, such as a Peltier element, an electrode, and a high voltage source. The electrode is arranged opposite the thermoelectric component. The high voltage source is configured to generate a high voltage between the thermoelectric component and the electrode sufficient to ignite the dielectric barrier discharge.

Embodiments relate to a device for generating a dielectric barrier discharge, in which a thermoelectric component acts as a counter-electrode, wherein the dielectric barrier discharge can be ignited between the electrode and the thermoelectric component acting as a counter-electrode. The dielectric barrier discharge can be ignited as an area discharge or as a volume discharge.

The thermoelectric component may be, in particular, a Peltier element or a component comprising a thermoelectric ceramic material.

The thermoelectric component can thereby cool a process gas. A strong flow of the process gas to cool the discharge area is therefore no longer necessary. Therefore, a high ozone concentration, for example more than 1000 ppm, can now be achieved in the dielectric barrier discharge, since there is no longer any dilution of the ozone concentration. In this regard, the process gas may have a flow rate between 1.5 liters per minute and 2.5 liters per minute, for example 2 liters per minute. In some embodiments, an ozone concentration of greater than 2000 ppm may be achieved.

The thermoelectric component also allows a temperature of the process gas to be adjusted during the dielectric barrier discharge. The temperature of the process gas has a significant effect on the composition of the gas generated during the dielectric barrier discharge. In particular, the proportion of ozone generated and nitrous gases generated is determined by the temperature. The thermoelectric component thus allows the generated concentration and generated amounts of reactive species in the dielectric barrier discharge to be adjusted. Moreover, these can be kept stable since the thermoelectric component prevents thermal drift. The device thus enables a precisely defined gas composition to be generated by the dielectric barrier discharge. This is critical in medical applications, for example. In addition, the device can enable an ignition voltage, above which plasma ignition is triggered, to also have no thermal drift and remain constant.

The thermoelectric component may also allow a humidity of the process gas to be adjusted. For example, the thermoelectric component may cool the process gas prior to the dielectric barrier discharge, thereby reducing its humidity. The humidity of the process gas also affects the composition and concentration of the species generated during the dielectric barrier discharge.

In the dielectric barrier discharge, one selected from the electrode and the thermoelectric component may be at a high voltage potential and the other may be at a low voltage potential or a ground potential. If the electrode is at the low voltage potential or the ground potential, the electrode can be formed by any sufficiently capacitive surface located near the thermoelectric component.

The thermoelectric component may have two or more thermoelectric elements, wherein the thermoelectric component has metal bridges meanderingly connecting the thermoelectric elements, wherein the thermoelectric component has a first ceramic plate covering the metal bridges on an upper side of the thermoelectric component facing the electrode, and wherein the thermoelectric component has a second ceramic plate covering the metal bridges on the lower side of the thermoelectric component. In this context, the top side may be referred to as the side of the thermoelectric component facing the electrode. The bottom side is the side of the thermoelectric component opposite the top side.

In this case, the thermoelectric elements can be arranged in a row, with two thermoelectric elements adjacent to one another being connected to one another in each case at their top side or at their bottom side by a metal bridge. Alternatively, the thermoelectric elements can be arranged in a two-dimensional matrix structure, with the metal bridges connecting the thermoelectric elements in a two-dimensional meandering shape, with mutually adjacent thermoelectric elements being connected to one another along the two-dimensional meandering shape at their top side or at their bottom side by a metal bridge.

The metal bridges can each be separated from one another by a non-metallized surface, with a maximum extent of the non-metallized surfaces, between two adjacent metal bridges, being smaller than a thickness of the first ceramic plate. The metal bridges may be arranged in an island shape on the first and second ceramic plates.

By dimensioning the metal bridges in this way, parasitic discharges on an inner side of the thermoelectric component between the metal bridges can be prevented.

The metal bridges and the first ceramic plate can be dimensioned such that the following inequality is satisfied:

$$D > U_{ignition}/U_{operation} \times \varepsilon_2/\varepsilon_1 \times A,$$

where D indicates the thickness of the first ceramic plate, $U_{ignition}$ indicates an ignition voltage above which plasma ignitions occur between the metal bridges, $U_{operation}$ indicates an operating voltage applied to the device, $\varepsilon_2$ indicates a dielectric constant of the first ceramic plate, $\varepsilon_1$ indicates a dielectric constant of the air, and A indicates a distance from adjacent metal bridges.

Further, the thermoelectric component may include a weakly conductive layer. The weakly conductive layer may be disposed between the first ceramic plate and the metal bridges. The weakly conductive layer may be disposed on an inner side of the first ceramic plate facing the metal bridges.

The weakly conductive layer can directly contact the metal bridges and the first ceramic plate. The weakly conductive layer can thereby compensate for inhomogeneities in the potential of the thermoelectric component formed by the island-shaped metal bridges. In this way, the weakly conductive layer can ensure that a discharge takes place homogeneously. In addition, the weakly conductive layer can prevent discharges on the inside of the ceramic plate.

The weakly conductive layer can be a layer applied to the first ceramic plate using thin-film technology. For example, the weakly conductive layer can be sputtered or printed onto the first ceramic plate.

Alternatively, the first ceramic plate can have a multilayer structure and accordingly be manufactured using thick-film technology. In this case, the weakly conductive layer can be a sublayer of the first ceramic plate. For example, the weakly conductive layer can be formed as the outermost layer of the multilayer structure, with the first ceramic plate being arranged on the metal bridges in such a way that the weakly conductive layer faces the metal bridges. Alternatively, the weakly conductive layer can be an inner layer of the multilayer structure arranged between two ceramic layers.

The first and second ceramic plates may comprise aluminum oxide and/or aluminum nitride. Aluminum oxide can provide high thermal conductivity for the respective ceramic plate and, thus, support a cooling or heating function. Aluminum oxide may provide that the respective ceramic plate is corrosion resistant and electrically insulated. The ceramic plates may have a multilayer structure comprising multiple sublayers, wherein the sublayers comprise, for example, aluminum oxide and aluminum nitride. Alternatively, the ceramic plates may comprise a single layer. A ceramic plate made from a single layer of aluminum nitride will oxidize on its surface facing the electrode during operation of the device, forming a layer of aluminum oxide that protects against corrosion.

The ceramic plates may further have metallized areas that provide field guidance. The metallized areas may be enclosed by aluminum oxide or aluminum nitride so that corrosion of the metallized areas is prevented.

The ceramic plates may further include an insulating region that an electric field does not penetrate.

The weakly conductive layer may consist of a metallization, for example nickel. The weakly conductive layer may have a thickness between 10 nm and 100 nm, preferably between 25 nm and 75 nm. A resistivity of the weakly conductive layer may be between $1 \times 10^{-2} \Omega \times mm^2/m$ and $1 \times 10^{-1} \Omega \times mm^2$. A sheet resistance of the weakly conductive layer may be between $0.2\Omega$ and $5\Omega$, preferably between $1.0\Omega$ and $2.0\Omega$. For example, the weakly conductive layer may consist of a thin 50 nm layer of nickel with a resistivity of $10^{-2} \Omega \times mm^2/m$, resulting in a sheet resistance of 1.4 ohms.

The weakly conductive layer can have a resistance that is greater by at least a factor of 100 than a resistance of the meander-shaped connection of the thermoelectric elements via the metal bridges. This can prevent a direct electrical current flowing across the thermoelectric element from being conducted across the weakly conductive layer. In this way, additional power dissipation due to a short circuit of the thermoelectric elements connected in series can be avoided. Accordingly, the weakly conductive layer does not impair the function of the thermoelectric component.

The weakly conductive layer may have at least one conductive element, for example Cr or Ni, and/or at least one semiconductive element, for example B or Si, and/or at least one insulating material, for example $SiO_2$ or $Al_2O_3$.

The weakly conductive layer can influence a surface conductivity of the thermoelectric component in a desired way to avoid parasitic discharges.

The device may include a conductive structure disposed between the second ceramic plate and the metal bridges disposed on the underside of the thermoelectric elements, and connected to a ground potential. The conductive structure may be provided as an alternative or in addition to the weakly conductive layer. The conductive structure may have an effect similar to that of the weakly conductive layer and may prevent parasitic discharges on the inner side of the bottom surface. In one embodiment, the conductive structure is reticular.

The thermoelectric component may be a Peltier element, wherein the thermoelectric elements comprise a semiconductor material. Alternatively, the thermoelectric component may be based on a thermoelectric ceramic material, wherein the thermoelectric elements comprise the thermoelectric ceramic material.

The thermoelectric ceramic material may comprise a calcium-manganese oxide having partial doping with Fe atoms at sites of Mn atoms. The thermoelectric ceramic material may have a material described by the general formula $Ca_{1-x-y}ISO_xDON_yMn_{1-z}Fe_zO_n$, wherein ISO denotes a divalent element capable of replacing $Ca^{2+}$ in the crystal lattice, DON denotes an element capable of replacing $Ca^{2+}$ in the crystal lattice and providing electrons for electrical conductivity, and where $0 \leq x \leq 0.5$; $0 < y \leq 0.5$; $0.0001 \leq z < 0.2$; $n \geq 2$. The thermoelectric ceramic material may have a material based on the composition $(Ca_{3-x}N_x)Co_4O_{9-\delta}$, with $0.1 \leq x \leq 2.9$ and $0 < \delta \leq 2$.

The high voltage source may be configured to apply a high voltage alternating potential to the electrode. The device may further include a DC voltage source configured to apply a low DC voltage to the thermoelectric component. A high voltage is thus generated between the electrode and the thermoelectric component, which triggers the dielectric barrier discharge. The device can be designed to ignite the dielectric barrier discharge as a volume discharge in a gap between the thermoelectric component and the electrode.

The thermoelectric component can have a metallization on a surface facing the electrode, whereby the high-voltage source is designed to apply a high-voltage potential to the thermoelectric component. The electrode may be at a ground potential or a potential close to ground. In this case, a dielectric barrier discharge can be initiated between the metallization and the electrode. The dielectric barrier discharge can ignite as a surface discharge at the metallization.

The metallization may consist of a conductive material and/or a semiconductive material, for example a mixture of bismuth and rhodium. The metallization can consist of a Mo/Mn paste baked in a hydrogen atmosphere or a W paste mixed with oxide coupling agents, for example Al oxide, Mn oxide, Mg oxide or Ti oxide.

The device can additionally have a fan, which is designed to guide a process gas through the gap between the electrode and the thermoelectric component, and/or a heat sink. The fan and the heat sink may contribute to cooling the process gas in addition to the thermoelectric component.

The thermoelectric component can be designed to cool or heat a process gas. Alternatively or additionally, the thermoelectric component can be designed to continuously change a temperature of a process gas in an operating cycle. In doing so, the process gas can pass through a wide temperature range. Within this temperature range, dielectric barrier discharges are ignited, whereby the entire spectrum of species from ROS to RNS can be passed through. In this way, for example, a particularly thorough disinfection of a surface can be achieved.

The electrode and/or the thermoelectric component may be coated with a glassy layer. The layer may be a melt glaze or a baked-on glaze. The layer may be chemically and thermally stable and may protect the electrode or thermoelectric component from oxidizing species generated during dielectric barrier discharge. Accordingly, the layer may extend a lifetime of the device.

The thermoelectric component may have an area that is not directly opposite the electrode. Accordingly, the thermoelectric component may have a larger areal extent than the electrode. The device can be designed in such a way that a process gas is first passed over the area of the thermoelectric component that does not face the electrode and only then enters a discharge area in which the thermoelectric component and the electrode face each other. In the region not directly facing the electrode, the temperature of the process gas can then be controlled by the thermoelectric component. For example, by cooling the process gas, moisture can be condensed out of the process gas and a drier process gas can be achieved.

The device may include a controller configured to initially operate the device in a cooling mode in which no dielectric barrier discharge is initiated and a surface of the device is cooled below a dew point, generating a film of water on the surface by condensation, and then operate the device in a discharging mode in which the dielectric barrier discharge is generated on the film of water.

The device may be configured to operate in a heating mode in which no dielectric barrier discharge is initiated and a surface of the device is heated to a temperature greater than 100°.

The device may include at least one sensor selected from a temperature sensor, an ozone sensor, and a humidity sensor, wherein the device is configured to adjust a power of the thermoelectric component and/or a power of the high voltage source in consideration of a measurement of the at least one sensor. By controlling the power of the high voltage source, a discharge power during the dielectric barrier discharge can be controlled. By controlling the power of the thermoelectric component, a heat transport power of the device can be controlled.

The electrode can be separately replaceable and/or the thermoelectric component can be separately replaceable. When replaced separately, it is not necessary to replace other components of the device. Accordingly, the electrode and/or the thermoelectric component may be replaced independently of the high voltage source. The electrode and thermoelectric component are typically subject to aging and wear due to plasma generation.

Another aspect relates to an appliance comprising the device described above. The device may be a refrigerator, a cool box, an air conditioner, a cooling device, a disinfector, a clothes dryer, a packaging appliance, a food processing appliance, a room decontamination appliance, a textile parasite control appliance, a waste collector, or a small sterilizer.

When the device is used in a cool box, refrigerator or cooling device in which perishable goods can be stored, the combination of cooling and dielectric barrier discharge is particularly advantageous. By generating oxidizing species during dielectric barrier discharge, undesirable microbiological processes, for example, rotting, mold growth, formation of microfilms or generation of unpleasant odors can be suppressed. In odor reduction, condensation on the cold surface of the thermoelectric component is very effective, since organic molecules that condense out together with water are thus also effectively decomposed in a second step by the dielectric barrier discharge, without producing an excess of ozone. The entire surface in the discharge area can be kept sterile by area discharge.

For a medical application, the device delivers a high ozone concentration of more than 10000 ppm in a given volume, enabling highly efficient sterilization processes with low equipment requirements.

Another aspect relates to a method of generating a dielectric barrier discharge using the device described above, wherein a high voltage is generated between the thermoelectric component and the electrode by the high voltage source and a dielectric barrier discharge is ignited in the gap.

Advantageous aspects are described below. To facilitate referencing, the aspects are numbered consecutively. Features of the aspects are relevant not only in combination with the specific aspect to which they relate, but also when considered separately.

1. Device for generating a dielectric barrier discharge, comprising
   a Peltier element,
   an electrode arranged opposite the Peltier element, and
   a high voltage source configured to generate a high voltage between the Peltier element and the electrode sufficient to ignite the dielectric barrier discharge.

2. Device according to aspect 1,
   wherein the Peltier element comprises two or more semiconductor elements arranged parallel to each other,
   wherein the Peltier element comprises metal bridges connecting the semiconductor elements in a meandering manner, two mutually adjacent semiconductor elements being connected to each other at their upper side or at their lower side by a metal bridge, and
   wherein the Peltier element has ceramic plates covering the metal bridges.

3. Device according to aspect 2, wherein the Peltier element has a weakly conductive layer disposed between the ceramic plates facing the electrode and the metal bridges.

4. Device according to aspect 3,
wherein the weakly conductive layer has a resistance which is greater by at least a factor of 100 than a resistance of the meander-shaped connection of the semiconductor elements via the metal bridges.

5. Device according to any of the preceding aspects,
wherein the high voltage source is configured to apply a high voltage alternating potential to the electrode, and
wherein the device comprises a DC voltage source configured to apply a low DC voltage to the Peltier element.

6. Device according to any of the preceding aspects,
wherein the device is configured to ignite the dielectric barrier discharge as a volume discharge between the Peltier element and the electrode.

7. Device according to any of aspects 1 to 4,
wherein the Peltier element has a metallization on a surface facing the electrode,
wherein the high voltage source is configured to apply a high voltage potential to the Peltier element.

8. Device according to aspect 7,
wherein the device is configured to ignite the dielectric barrier discharge as a surface discharge on the metallization.

9. Device according to any of the previous aspects,
wherein the Peltier element is configured to cool a process gas or heat a process gas, and/or
wherein the Peltier element is configured to continuously change a temperature of a process gas in an operating cycle.

10. Device according to any of the preceding aspects, wherein the electrode and/or the Peltier element are coated with a glassy layer.

11. Device according to any of the preceding aspects, wherein an area of the Peltier element is larger than an area of the electrode.

12. Device according to any of the preceding aspects, wherein the device comprises a controller configured to operate the device in a cooling mode in which no dielectric barrier discharge is initiated and a surface of the device is cooled below a dew point of a process gas so that a water film is generated on the surface by condensation, and to subsequently operate the device in a discharging mode in which the dielectric barrier discharge is generated on the water film.

13. Device according to any of the preceding aspects,
wherein the device is configured to operate in a heating mode in which no dielectric barrier discharge is initiated and a surface of the device is heated to a temperature greater than 100° C.

14. Device according to any of the preceding aspects, wherein the device comprises at least one sensor selected from a temperature sensor, an ozone sensor, and a humidity sensor; and wherein the device is configured to adjust a power of the Peltier element and/or a power of the high voltage source taking into account a measurement of the at least one sensor.

15. Appliance comprising a device according to any of the preceding aspects, wherein the appliance is a refrigerator, a cool box, an air conditioner, a cooling device, a clothes dryer, a packaging appliance, a food processing appliance, a room decontamination appliance, a textile parasite control appliance, a waste collector or a small sterilizer.

16. A method of generating a dielectric barrier discharge using an device according to any one of aspects 1 to 14, wherein a high voltage is generated between the Peltier element and the electrode by the high voltage source and a dielectric barrier discharge is ignited.

BRIEF DESCRIPTION OF THE DRAWINGS

In the following, preferred embodiments of the present invention are explained in more detail with reference to the figures.

DETAILED DESCRIPTION OF ILLUSTRATIVE EMBODIMENTS

Figure 1:
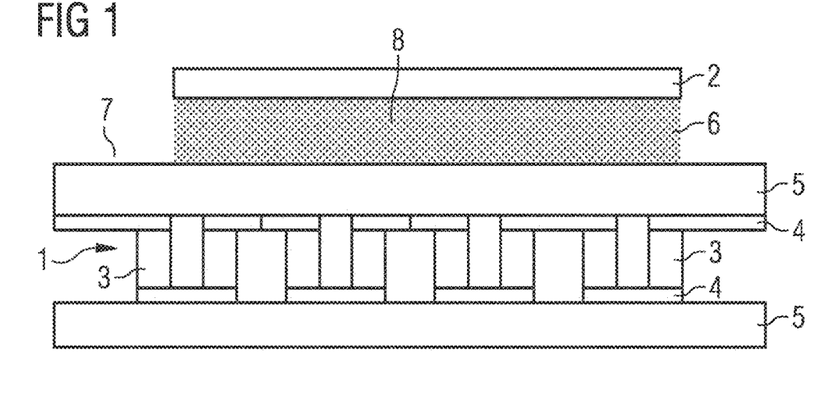
FIG. 1 shows a device for generating a dielectric barrier discharge according to a first embodiment.

FIG. 1 shows a device for generating a dielectric barrier discharge, which has a thermoelectric component 1 and an electrode 2. The thermoelectric component 1 is a Peltier element.

The thermoelectric component 1 is an electrothermal transducer. It is designed to change a temperature of a process gas. If a DC voltage is applied to the thermoelectric component 1 and a DC current flows via the thermoelectric component 1, a temperature difference is generated based on the Peltier effect or the Seeback effect or the Thomson effect. The Peltier element 1 can be used both for cooling and—when the current direction is reversed—for heating the process gas.

The thermoelectric component 1 has thermoelectric elements 3 interconnected by metal bridges 4 to form a meandering structure.

If the thermoelectric component 1 is a Peltier element, semiconductor elements, in particular semiconducting ceramic plates, are used as thermoelectric elements. In this case, the semiconductor elements are connected in series with one another by the metal bridges 4, with p-doped semiconductor elements and n-doped semiconductor elements alternating. The semiconductor elements may, for example, comprise bismuth telluride or silicon germanium.

When a direct current is passed through the thermoelectric component 1, heat or cold is generated at the metal bridges 4 due to the thermoelectric effect, for example the Peltier effect.

The thermoelectric component 1 has a first ceramic plate 5a and a second ceramic plate 5b. The first ceramic plate 5a is arranged on an upper side facing the electrode. The second ceramic plate 5b is arranged on a lower side facing away from the electrode.

The ceramic plates 5a, 5b may have aluminum oxide or consist of aluminum oxide. Alternatively or complementarily, the ceramic plates 5a, 5b may comprise aluminum nitride or consist of aluminum nitride. The ceramic plates 5a, 5b may have a multilayer structure comprising a layer of aluminum oxide and a layer of aluminum nitride. Aluminum nitride exhibits the advantage of high thermal conductivity. Aluminum oxide exhibits high corrosion resistance. A multilayer structure of the ceramic plates 5a, 5b may have an outermost layer of aluminum oxide as a corrosion-resistant protective layer.

The ceramic plates 5a, 5b cover the metal bridges 4. In the example shown in FIG. 1, the ceramic plates 5a, 5b are arranged directly on the metal bridges 4. The metal bridges 4 form a thermal contact surface via which heat or cold is transferred to the ceramic plates 5a, 5b. The ceramic plates 5a, 5b act as heat conducting plates. The ceramic plates 5a, 5b transfer the heat or cold to the process gas.

The electrode 2 is arranged parallel to one of the first ceramic plates 5a. The electrode 2 faces the thermoelectric component 1 and is thereby spatially separated from the thermoelectric component 1. There is a gap 6 between the electrode 2 and the thermoelectric component 1. The gap 6 between the thermoelectric component 1 and the electrode 2 can have a width between 0.01 mm and 1.0 mm, preferably between 0.05 mm and 0.5 mm.

The device is designed to trigger a dielectric barrier discharge between the electrode 2 and the thermoelectric component 1. The dielectric barrier discharge is an ignition of a non-thermal atmospheric pressure plasma.

An alternating voltage potential with a high amplitude is applied to electrode 2 with reference to an electric potential of thermoelectric component 1. A high voltage is thus generated between the thermoelectric component 1 and the electrode 2. A dielectric barrier discharge is ignited between the thermoelectric component 1 and the electrode 2, with the ceramic plate 5 facing the electrode 1 acting as a dielectric barrier.

A direct current flows through the thermoelectric component 1. A DC potential difference through the low-resistance thermoelectric elements 3 of the thermoelectric component 1 is negligible in relation to the high voltage required for the dielectric barrier discharge. Conversely, the current density typically encountered during dielectric barrier discharge is small relative to the DC current flowing through the thermoelectric elements 3. Accordingly, the cooling function of the thermoelectric component 1 and the discharge function of the device do not negatively affect each other.

Thermoelectric element 1 is used in the device both in its function as a cooling or heating element that sets a temperature of the process gas, and as a counter electrode that triggers the dielectric barrier discharge together with electrode 2. By combining the thermoelectric element 1 with the dielectric barrier discharge, the dielectric barrier discharge can be operated at a precisely set temperature and humidity, and the concentration and composition of active species produced in the dielectric barrier discharge can be set and kept stable.

The thermoelectric element 1 makes it possible to control a temperature of the process gas located in the gap 6 between the electrode 2 and the thermoelectric element 1. When a thermoelectric element 1 is used for dielectric barrier discharge, it is possible to precisely adjust the temperature of the process gas during discharge. The gas composition of the gases generated in the dielectric barrier discharge when air is used as the process gas depends very much on the temperature of the air. In particular, the proportions of generated ozone ($O_3$) and generated nitrous gases (NO, $NO_2$, $NO_x$) are determined by the temperature. With increasing temperature, the generation of nitrous gases is favored and the ozone decomposition mechanisms in favor of nitrous gases are accelerated.

The device can be operated in different modes. A first operating mode is a pure cooling mode, in which the thermoelectric element 1 cools the process gas and no high voltage is generated between the thermoelectric element and the electrode 2. If the process gas is cooled below its dew point in this process, water is formed by condensation and settles as a water film on a surface of the thermoelectric element 1.

A second mode of operation of the device is a discharge mode. In the discharge mode, a high voltage is applied between the thermoelectric element 1 and the electrode 2, and a dielectric barrier discharge is initiated between the electrode 2 and the thermoelectric element 1. In addition, the thermoelectric element 1 can simultaneously cool or heat the process gas.

The discharging mode may immediately follow the cooling mode, wherein a water film has been generated on a surface of the thermoelectric element 1 in the cooling mode. In this case, the dielectric barrier discharge is generated on the water film. In particular, peroxide species are generated and ozone emission is low.

A third mode of operation of the device is a heating mode. In the heating mode, no high voltage is applied between the thermoelectric element 1 and the electrode 2 and the thermoelectric element 1 heats the process gas. In this case, the thermoelectric element 1 can reach a temperature of more than 100° C. At such high temperatures, ozone is decomposed. If the thermoelectric element 1 is operated in its heating mode following the discharge mode, an ozone concentration built up in an effective volume by the dielectric barrier discharge can be quickly reduced to a low level again. The device can be operated so that cooling mode, discharging mode, and heating mode are repeated sequentially in a predetermined time sequence.

The thermoelectric element 1 can be operated in the discharge mode in such a way that it continuously heats or cools the process gas over a wide temperature range. Thereby, a dielectric barrier discharge can be triggered continuously while the process gas undergoes a continuous transition from a low temperature to a high temperature. In this way, the entire spectrum of species from ROS (Reactive Oxygen Species) to RNS (Reactive Nitrogen Species) can be generated. This can be used, for example, to effect thorough disinfection.

By heating and/or cooling the process gas, the thermoelectric element 1 can also control the humidity of the process gas. For example, moisture can be condensed out of the process gas in a cooling process. The humidity of the process gas affects the composition of the gases produced during the dielectric barrier discharge. For example, the presence of humidity can lead to the generation of peroxide $H_2O_2$.

The area of the thermoelectric element 1 is larger than the area of the opposite electrode 2. The thermoelectric element 1 has a first area 7 in which the electrode 2 is not directly opposite the thermoelectric element 1. The process gas may first be directed across the first region 7 of the thermoelectric element 1 in which the electrode 2 does not directly oppose the thermoelectric element 1, and then the process gas may be directed into a discharge region 8 in which the electrode 2 opposes the thermoelectric element 1 and in which the dielectric barrier discharge is ignited. This allows the thermoelectric element 1 in the first area 7 to cool the process gas before the dielectric barrier discharge occurs. In this way, active condensation of moisture from the process gas is achieved even before the dielectric barrier discharge. The process gas dried in this way can then reach the discharge area. If the process gas is dried outside the discharge area before the dielectric barrier discharge, a higher ozone concentration is achieved during the dielectric barrier discharge compared to a process gas that was not dried beforehand.

Figure 2:
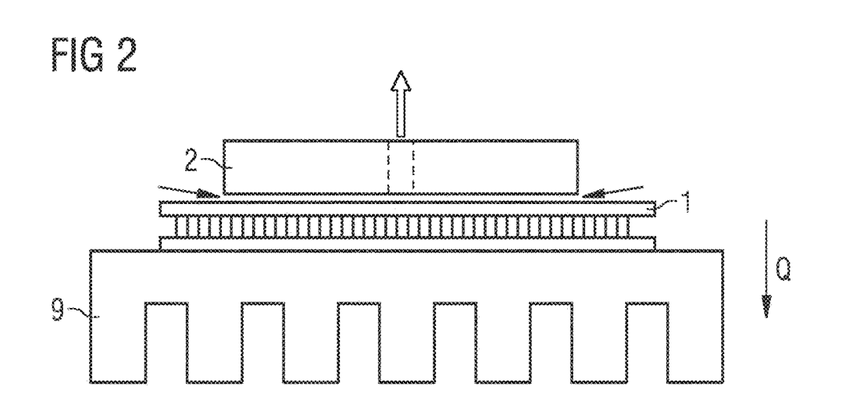
FIG. 2 shows the device according to a second embodiment.

FIG. 2 shows a second embodiment of the device. In the embodiment shown in FIG. 2, a heat sink 9 is additionally attached to the ceramic plate of the thermoelectric element 1 facing away from the electrode 2. The heat sink 9 contributes to cooling the process gas in addition to the thermoelectric element 1. In addition, in the second embodiment, the electrode 2 is also provided with a heat sink 9. The heat sink 9 associated with the electrode 2 has a gas outlet. Both the heat sink 9 connected to the thermoelectric element 1 and the heat sink 9 connected to the electrode 2 are optional and may be omitted in other embodiments.

In FIG. 2, the arrow marked Q indicates the direction of heat transport through thermoelectric element 1. The thermoelectric element 1 cools the process gas. Further arrows indicate the flow direction of the process gas.

Furthermore, the device may alternatively or additionally comprise a fan that supports a flow of the process gas along the thermoelectric element 1.

Figure 3:
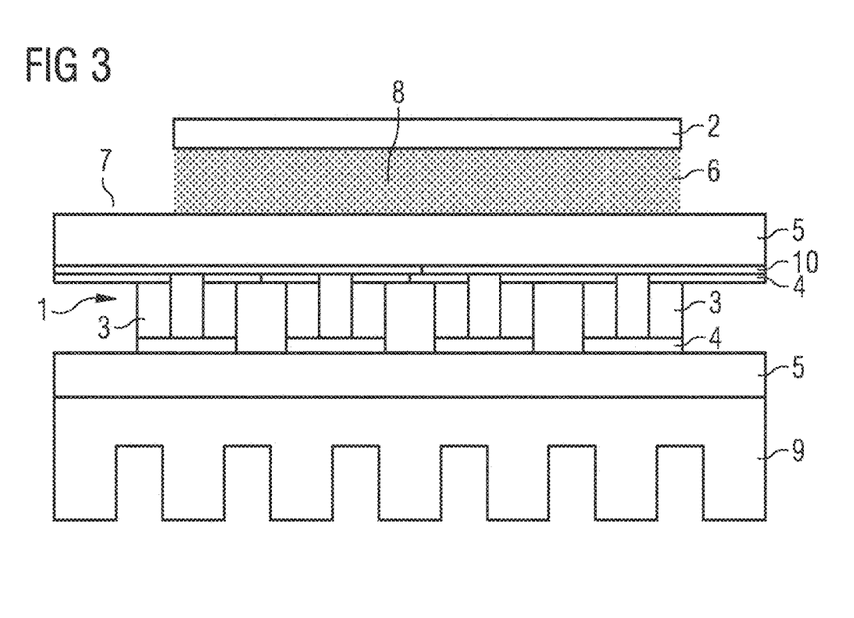
FIG. 3 and FIG. 4 show the device according to a third embodiment.

In the embodiments shown in FIGS. 1 and 2, an inner side of the first ceramic plate 5a facing the electrode 2 is metallized by the metal bridges 4. The metal bridges 4 do not form a continuous surface, but rather island-shaped metallizations on the inner side. This can lead to inhomogeneous discharges during dielectric barrier discharge. In addition, the island-shaped metallizations can lead to parasitic discharges on the inner side of the ceramic plate 5a. FIG. 3 shows a third embodiment of the device that overcomes these undesirable side effects.

In the third embodiment, a weakly conductive layer 10 is disposed between the metal bridges 4 and the first ceramic plate 5a. The weakly conductive layer 10 can compensate for potential differences between the island-shaped metallizations. It has a resistance that is high-resistance compared to the internal resistance of the meander-shaped junction formed by the thermoelectric elements 3 and the metal bridges 4. For example, the resistance of the weakly conductive layer 10 may be more than one hundred times the resistance of the meander-shaped junction. Accordingly, a current flowing through the thermoelectric component does not flow through the weakly conductive layer, but through the metal bridges 4 and the thermoelectric elements 3. Thus, the weakly conductive layer 10 does not interfere with the cooling or heating function of the thermoelectric component 1.

The conductivity of the weakly conductive layer 10 is sufficient for the thermoelectric component 1 to act as a two-dimensional counter-electrode during the dielectric barrier discharge and to prevent an inhomogeneous discharge. In addition, the metal bridges 4 are connected to each other via the weakly conductive layer 10 in such a way that parasitic discharges do not occur at the metal bridges 4. The weakly conductive layer 10 thus makes it possible to overcome the undesirable side effects from the first two embodiments.

In the embodiment shown in FIG. 3, the weakly conductive layer 10 is arranged between the metal bridges 4 and the first ceramic plate 5a. No weakly conductive layer 10 is arranged between the metal bridges 4 and the second ceramic plate 5b. In an alternative embodiment, a weakly conductive layer 10 is also arranged between the metal bridges 4 and the second ceramic plate 5b. In another alternative embodiment, a conductive mesh-like structure is arranged between the metal bridges 4 and the second ceramic plate 5b, which is at a ground potential. The conductive mesh-like structure can prevent parasitic discharges on the inner surface of the second ceramic plate 5b. The conductive mesh-like structure has no conductive connection to the metal bridges 4 between which it is located.

Figure 4:
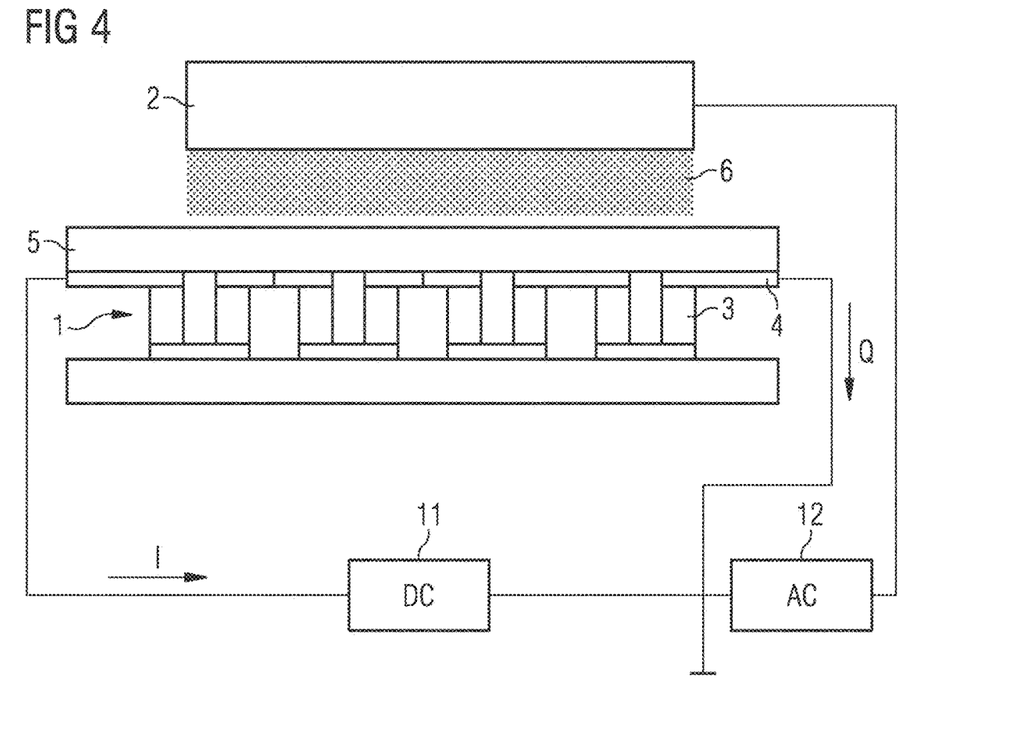

FIG. 4 also shows the embodiment shown in FIG. 3. FIG. 4 further shows a DC voltage source 11 and a high voltage source 12. The DC voltage source 11 applies a DC voltage in the low-voltage range to the thermoelectric component 1. A direct current therefore flows across the thermoelectric component 1. The thermoelectric component 1 is at a low-voltage electrical potential. The high-voltage source 12 applies a high AC potential to the electrode 2. Accordingly, a high potential difference occurs between the thermoelectric component 1 and the electrode 2 and a dielectric barrier discharge occurs in the gap 6 between the electrode 2 and the thermoelectric component 1. The dielectric barrier discharge is a volume discharge.

Figure 5:
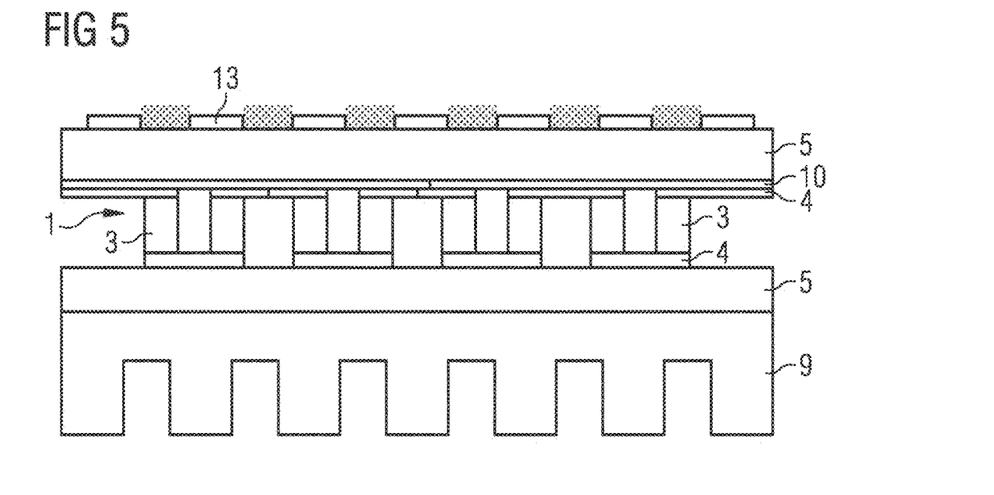
FIGS. 5, 6 and 7 show the device according to a fourth embodiment.
Figures 6, 7:
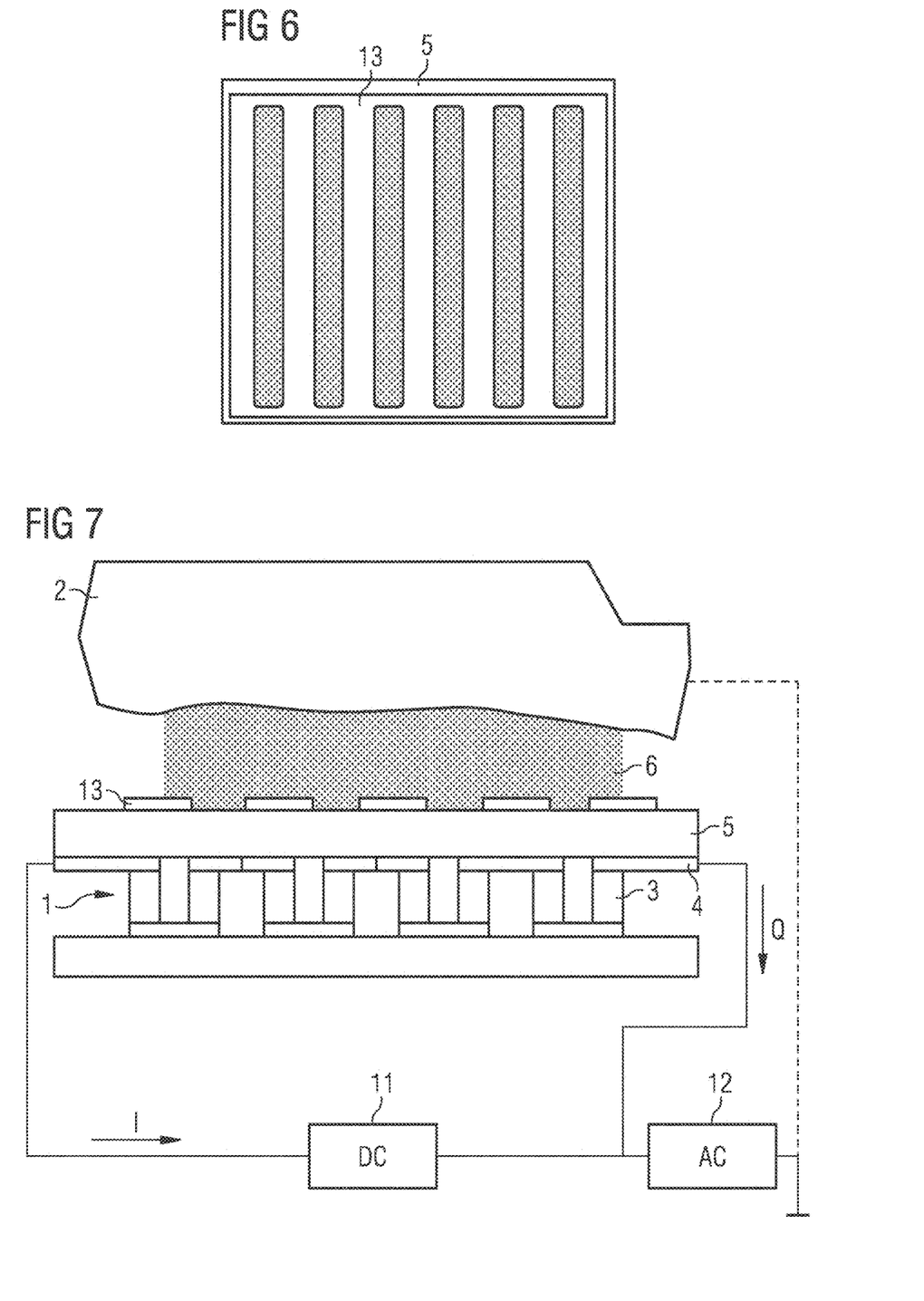

FIGS. 5, 6 and 7 show a fourth embodiment of the device, wherein a dielectric barrier discharge is initiated at the thermoelectric component 1 as an area discharge. In FIG. 5, the electrode 2 is not shown. FIG. 6 shows a top view of the thermoelectric component 1 covered by the first ceramic plate 5a and a metallization 13.

Also in this embodiment, a weakly conductive layer 10 may be disposed between the first ceramic plate 5a and the metal bridges 4. A surface of the first ceramic plate 5a is provided with a metallization 13. This metallization 13 acts as an electrode. A high voltage potential can be applied to the metallization 13. The entire thermoelectric component 1 is applied to a high AC voltage potential. Together with the thermoelectric component 1, the planar electrode 2 acts, which can be at a ground potential. It is sufficient to trigger a dielectric barrier discharge if the electrode 2 has a sufficiently high capacitance.

The metallization 13 has recesses in which the first ceramic plate 5a is not covered by the metallization 13. The dielectric barrier discharge is ignited as an area discharge in the recesses.

In the embodiment shown in FIGS. 5 to 7, the thermoelectric component 1 may be cooled and raised to a high AC potential with respect to a surface, such as a portion of human skin or another surface to be processed. A cold dielectric barrier discharge occurs in the gap 6 between the thermoelectric component 1 and the surface. Such applications are possible, for example, in dermatology and wound treatment. The surface forms the electrode 2.

FIG. 7 shows the thermoelectric component 1, the electrode 2, the DC voltage source 11 and the high voltage source 12. The DC voltage source 11 applies a DC voltage to the thermoelectric component 1. A direct current therefore flows across the thermoelectric component 1, which triggers the Peltier effect and causes a process gas to be cooled or heated.

The high-voltage source 12 applies a high-voltage alternating potential to the thermoelectric component 1. The DC voltage source 11 is also at the high-voltage alternating potential applied by the high-voltage source 12.

The electrode 2 is at a ground potential. It is not connected to the high voltage source 12. A high voltage is generated between the electrode 2 and the metallization 13 of the thermoelectric component 1, which triggers the ignition of the dielectric discharge as a surface discharge at the metallization 13 of the thermoelectric component 1.

Figure 8:
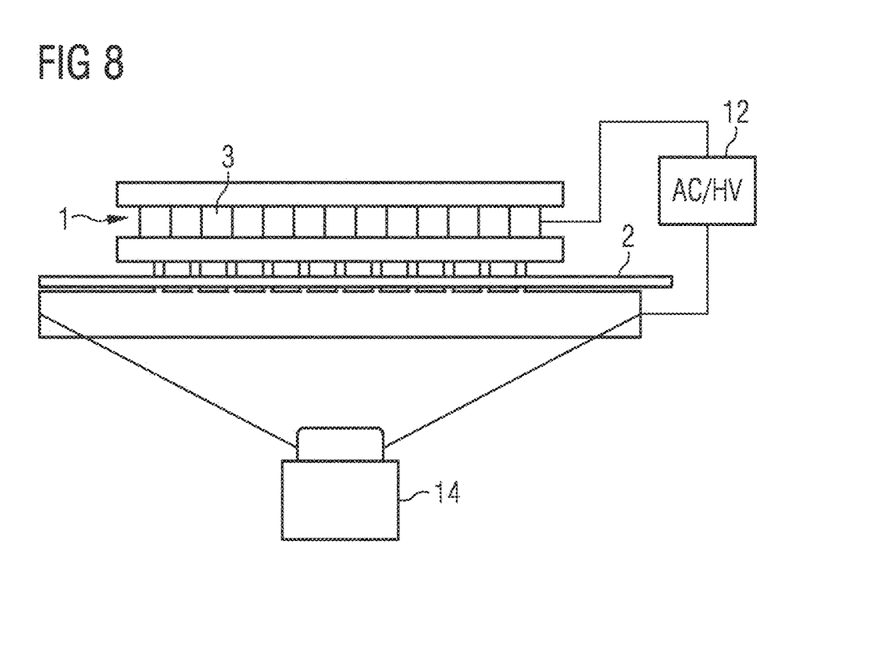
FIG. 8 shows another embodiment of the device.
Figure 9:
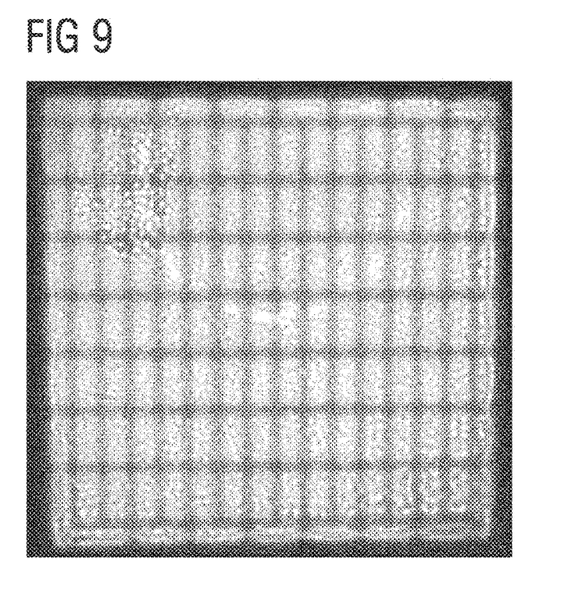
FIG. 9 shows a firing pattern of the device shown in FIG. 8.
Figure 10:
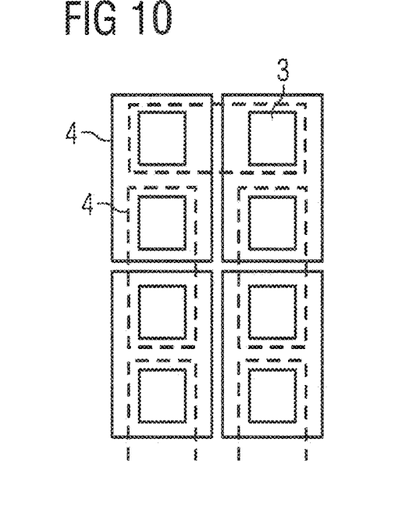
FIG. 10 schematically shows the interconnection of the thermoelectric elements through the metal bridges to form a two-dimensional meander shape.

FIG. 8 shows a further embodiment of the device, whereby the device in FIG. 8 is additionally combined with a camera 14. The camera 14 is used only for recording an image of a firing pattern generated by the device. FIG. 9 shows a firing pattern taken with the camera 14. FIG. 10 shows schematically the interconnection of the thermoelectric elements 3 by the metal bridges 4.

In the embodiment shown in FIG. 8, the thermoelectric component 1 has a plurality of thermoelectric elements 3 arranged in a matrix structure. The thermoelectric elements 3 are further interconnected via metal bridges 4 to form a two-dimensional meander shape. From the firing pattern shown in FIG. 9, the arrangement and interconnection of the thermoelectric elements 3 can be seen. The interconnection of the thermoelectric elements 3 is also shown for a section of the device in FIG. 10. Metal bridges 4, which are arranged on the upper side of the thermoelectric elements 3, are marked by a solid line and metal bridges 4, which are arranged on the lower side of the thermoelectric elements 3, are drawn with a dashed line.

A plate of indium tin oxide (ITO) is used as electrode 2 in the embodiment shown in FIG. 8. On a side of the plate of indium oxide facing away from the thermoelectric component, the camera 14 is arranged. In this way, the camera 14 can capture the firing pattern of the thermoelectric component.

The high voltage source 12 applies an AC voltage between the thermoelectric component 1 and the plate of indium tin oxide.

The metal bridges 4 are arranged in an island shape on the first ceramic plate 5a and each connect two thermoelectric elements to each other. Two adjacent metal bridges 4 are separated from each other by a non-metallized surface.

The result is a structured firing pattern which follows the position pattern of the metal bridges 4. The firing pattern is composed of individual firing spots. The area of the firing spots is larger than the area of the respective metal bridge.

An ignition voltage for igniting a dielectric barrier discharge between the thermoelectric component 1 and the electrode 2 is lower for the embodiment shown in FIG. 8 than for a homogeneous discharge between the thermoelectric component and the electrode.

The embodiment results in high ozone generation.

At the points of the firing pattern where the highest discharge density is present, the cooling power of the thermoelectric component 1 is also highest. This results in a device in which the cooling power density of the thermoelectric component always matches the heat generation that occurs during the dielectric discharge.

Figure 11:
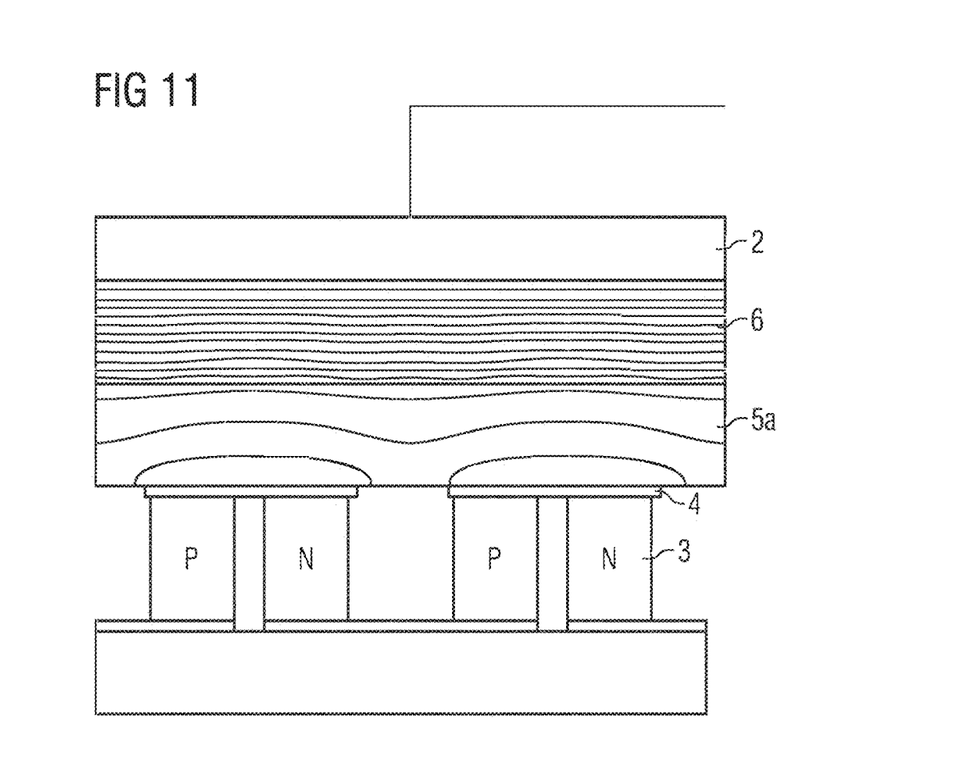
FIG. 11 shows a cross-section of a section of the device shown in FIG. 8.

FIG. 11 shows a cross-section through a section of the device shown in FIG. 8. With reference to FIG. 11, it will be explained below that parasitic discharges on the inside of the first ceramic plate 5a can be avoided by suitable dimensioning of the metal bridges 4 and the thickness of the first ceramic plate 5a.

In the embodiment shown in FIG. 10, the course of an electric field within the first ceramic plate 5a and within the gap 6 between the thermoelectric element 1 and the electrode 2 is shown. Isopotential lines are drawn for this purpose. Here, a high density of the isopotential lines is equivalent to a high field strength. Aluminum oxide is used here as the material of the first ceramic plate 5a. Within the ceramic plate 5a, the field strength is low. In particular, within the ceramic plate 5a, the field strength is below an ignition voltage, above which ignition of parasitic discharges between the metal bridges occurs. The ignition voltage may be 300 V/mm.

A higher field strength is present in the gap 6, which can be greater than 2 kV/mm, for example. A dielectric barrier discharge is therefore ignited in the gap.

Based on the course of the isopotential lines, it can be seen that the thickness of the first ceramic plate 5a and the distance between two adjacent metal bridges 4 significantly influence the field strength on the inside of the first ceramic plate. To avoid parasitic discharges, the distance between adjacent metal bridges 4 must not be too high. In particular, the following inequality must be satisfied to avoid parasitic discharges:

$$D > U_{ignition}/U_{operation} \times \varepsilon_2/\varepsilon_1 \times A,$$

where D indicates the thickness of the first ceramic plate. $U_{ignition}$ specifies an ignition voltage above which plasma ignitions occur between the metal bridges. $U_{operation}$ specifies an operating voltage applied to the device. $\varepsilon_2$ indicates a dielectric constant of the first ceramic plate. $\varepsilon_1$ indicates a dielectric constant of air and A indicates a distance from adjacent metal bridges.

By appropriately dimensioning the metal bridges 4, parasitic discharges can be excluded even in a device that does not have a weakly conductive layer 10 between the metal bridges 4 and the first ceramic plate 5a.

Furthermore, in each of the embodiments shown in FIGS. 1 to 10, the surface of the thermoelectric component 1 facing the electrode 2 and/or the electrode 2 may be coated with a glassy layer. This layer may be baked on as a fusible glaze or a baked-on glaze. The glassy layer is chemically and thermally stable. It can protect the thermoelectric component 1 or electrode 2 from oxidizing species generated during dielectric barrier discharge. Accordingly, the layer increases the lifetime of the device, especially when used under high humidity.

Instead of a single-stage thermoelectric component 1, several thermoelectric components can also be combined to form a multi-stage thermoelectric component in order to achieve a higher temperature difference.

The operating modes described above, discharge mode, cooling mode, and heating mode, may be used in any of the four embodiments shown.

As a thermoelectric component, a thermoelectric component comprising thermoelectric elements made of a thermoelectric ceramic material can be used as an alternative to a Peltier element.

The invention claimed is:

1. A device for generating a dielectric barrier discharge, the device comprising:
   a thermoelectric component;
   an electrode arranged opposite the thermoelectric component; and
   a high voltage source configured to generate a high voltage between the thermoelectric component and the electrode sufficient to ignite the dielectric barrier discharge,
   wherein an area of the thermoelectric component is larger than an area of the electrode.

2. The device according to claim 1,
   wherein the thermoelectric component comprises two or more thermoelectric elements, and metal bridges connecting the thermoelectric elements, and
   wherein the thermoelectric component further comprises a first ceramic plate covering the metal bridges on an upper surface of the thermoelectric component facing the electrode, and a second ceramic plate covering the metal bridges at a bottom side of the thermoelectric component.

3. The device according to claim 2, wherein the first ceramic plate comprises aluminum oxide and/or aluminum nitride.

4. The device according to claim 2, wherein the first ceramic plate has an insulating region so that an electric field does not penetrate and/or a conductive region along which the electric field is guided.

5. The device according to claim 2,
wherein the thermoelectric elements are arranged in a row, and
wherein two thermoelectric elements adjacent to each other are connected to each other in a meandering manner on their upper side or on their lower side by a metal bridge.

6. The device according to claim 2,
wherein the thermoelectric elements are arranged in a two-dimensional matrix structure,
wherein the metal bridges connect the thermoelectric elements in a two-dimensional meander shape, and
wherein thermoelectric elements adjacent to each other along the two-dimensional meander shape are connected to each other at their upper side or at their lower side by a metal bridge.

7. The device according to claim 2, wherein the metal bridges are each separated by a non-metallized surface, wherein a maximum extension of the non-metallized surfaces, between two adjacent metal bridges, is smaller than a thickness of the first ceramic plate.

8. The device according to claim 2,
wherein the metal bridges and the first ceramic plate are dimensioned such that the following inequality is satisfied:

$$D > U_{ignition}/U_{operation} \times \varepsilon_2/\varepsilon_1 \times A, \text{ and}$$

wherein D indicates a thickness of the first ceramic plate, $U_{ignition}$ indicates an ignition voltage above which plasma ignitions occur between the metal bridges, $U_{operation}$ indicates an operating voltage applied to the device, $\varepsilon_2$ indicates a dielectric constant of the first ceramic plate, $\varepsilon_1$ indicates a dielectric constant of air, and A indicates a distance from adjacent metal bridges.

9. The device according to claim 2, further comprising a weakly conductive layer disposed on an inner side of the first ceramic plate facing the metal bridges.

10. The device according to claim 9, wherein the weakly conductive layer is a layer deposited on the first ceramic plate using thin film technology.

11. The device according to claim 9, wherein the first ceramic plate has a multilayer structure, the weakly conductive layer being formed as a sublayer of the first ceramic plate.

12. The device according to claim 9, wherein the weakly conductive layer has a resistance that is greater by at least a factor of 100 than a resistance of a meander-shaped connection of the thermoelectric elements via the metal bridges.

13. The device according to claim 9, wherein the weakly conductive layer comprises at least one conductive element comprising Cr or Ni, and/or at least one semiconductive element comprising B or Si, and/or at least one insulating material comprising $SiO_2$ or $Al_2O_3$.

14. The device according to claim 2, further comprising a conductive structure, which is arranged between the second ceramic plate and the metal bridges arranged at bottom sides of the thermoelectric elements, and which is connected to ground potential.

15. The device according to claim 14, where the conductive structure is reticular.

16. The device according to claim 2,
wherein the thermoelectric component is a Peltier element, and
wherein the thermoelectric elements comprise a semiconductor material or semiconducting ceramic material.

17. The device according to claim 2, wherein the thermoelectric elements comprise a thermoelectric ceramic material.

18. The device according to claim 17,
wherein the thermoelectric ceramic material comprises a calcium-manganese oxide being partially doped with Fe atoms at sites of Mn atoms, or
wherein the thermoelectric ceramic material comprises a material described by the general formula $Ca_{1-x-y}ISO_xDON_yMn_{1-z}Fe_zO_n$, where ISO denotes a divalent element capable of replacing $Ca^{2+}$ in a crystal lattice, DON denotes an element that is able to replace $Ca^{2+}$ in the crystal lattice and provides electrons for electrical conductivity, and where $0 \leq x \leq 0.5$, $0 < y \leq 0.5$, $0.0001 \leq z < 0.2$, $n \geq 2$, or wherein the thermoelectric ceramic material comprises a material based on the composition $(Ca_{3-x}Na_x)Co_4O_{9-\delta}$, with $0.1 \leq x \leq 2.9$ and $0 < \delta \leq 2$.

19. The device according to claim 1,
wherein the high voltage source is configured to apply a high voltage alternating potential to the electrode, and
wherein the device comprises a DC voltage source configured to apply a low DC voltage to the thermoelectric component.

20. The device according to claim 1, wherein the device is configured to ignite the dielectric barrier discharge as a volume discharge between the thermoelectric component and the electrode.

21. The device according to claim 1, wherein the thermoelectric component has a metallization on a surface facing the electrode, wherein the high voltage source is configured to apply a high voltage potential to the thermoelectric component.

22. The device according to claim 21, wherein the metallization consists of a conductive material and/or of a semiconductive material comprising a mixture of bismuth and rhodium.

23. The device according to claim 21, wherein the metallization consists of a Mo/Mn paste baked in a hydrogen atmosphere or a W paste mixed with oxide coupling agents.

24. The device according to claim 21, wherein the device is configured to ignite the dielectric barrier discharge as a surface discharge on the metallization.

25. The device according to claim 1,
wherein the thermoelectric component is configured to cool a process gas or heat the process gas, and/or
wherein the thermoelectric component is configured to continuously change a temperature of the process gas in an operating cycle.

26. The device according to claim 1, wherein the electrode and/or the thermoelectric component are coated with a glassy layer.

27. The device according to claim 1, further comprising a controller configured to:
operate the device in a cooling mode in which no dielectric barrier discharge is initiated and a surface of the device is cooled below a dew point of a process gas so that a water film is generated on the surface by condensation, and
subsequently operate the device in a discharging mode in which the dielectric barrier discharge is generated on the water film.

28. The device according to claim 1, further comprising a controller configured to operate in a heating mode in which no dielectric barrier discharge is initiated and a surface of the device is heated to a temperature greater than 100° C.

29. The device according to claim 1, further comprising at least one sensor selected from a temperature sensor, an ozone sensor, or a humidity sensor, wherein the device is configured to adjust a power of the thermoelectric component and/or a power of the high voltage source taking into account a measurement of the at least one sensor.

30. The device according to claim 1, wherein the electrode is separately replaceable and/or wherein the thermoelectric component is separately replaceable.

31. An appliance comprising:
the device according to claim 1,
wherein the appliance is a refrigerator, a cool box, an air conditioner, a cooling device, a disinfector, a clothes dryer, a packaging appliance, a food processing appliance, a room decontamination appliance, a textile parasite control appliance, a waste collector or a small sterilizer.

32. A method for generating the dielectric barrier discharge with the device according to claim 1, the method comprising:
generating, by the high voltage source, the high voltage between the thermoelectric component and the electrode; and
igniting the dielectric barrier discharge.

33. A device for generating a dielectric barrier discharge, the device comprising:
a thermoelectric component;
an electrode arranged opposite the thermoelectric component;
a high voltage source configured to generate a high voltage between the thermoelectric component and the electrode sufficient to ignite the dielectric barrier discharge; and
a controller configured to:
operate the device in a cooling mode in which no dielectric barrier discharge is initiated and a surface of the device is cooled below a dew point of a process gas so that a water film is generated on the surface by condensation, and
subsequently operate the device in a discharging mode in which the dielectric barrier discharge is generated on the water film.

34. A device for generating a dielectric barrier discharge, the device comprising:
a thermoelectric component;
an electrode arranged opposite the thermoelectric component; and
a high voltage source configured to generate a high voltage between the thermoelectric component and the electrode sufficient to ignite the dielectric barrier discharge,
wherein the thermoelectric component comprises two or more thermoelectric elements, and metal bridges connecting the thermoelectric elements,
wherein the thermoelectric component further comprises a first ceramic plate covering the metal bridges on an upper surface of the thermoelectric component facing the electrode, and a second ceramic plate covering the metal bridges at a bottom side of the thermoelectric component,
wherein the metal bridges and the first ceramic plate are dimensioned such that the following inequality is satisfied:

$$D > U_{ignition}/U_{operation} \times \varepsilon_2/\varepsilon_1 \times A, \text{ and}$$

wherein D indicates a thickness of the first ceramic plate, $U_{ignition}$ indicates an ignition voltage above which plasma ignitions occur between the metal bridges, $U_{operation}$ indicates an operating voltage applied to the device, $\varepsilon_2$ indicates a dielectric constant of the first ceramic plate, $\varepsilon_1$ indicates a dielectric constant of air, and A indicates a distance from adjacent metal bridges.

35. A device for generating a dielectric barrier discharge, the device comprising:
a thermoelectric component;
an electrode arranged opposite the thermoelectric component; and
a high voltage source configured to generate a high voltage between the thermoelectric component and the electrode sufficient to ignite the dielectric barrier discharge,
wherein the electrode and/or the thermoelectric component are coated with a glassy layer.

* * * * *